United States Patent
Kawashima

(10) Patent No.: US 8,767,504 B2
(45) Date of Patent: Jul. 1, 2014

(54) ACTIVATE SIGNAL GENERATING CIRCUIT AND SEMICONDUCTOR MEMORY DEVICE

(71) Applicant: Fujistu Semiconductor Limited, Yokohama (JP)

(72) Inventor: Shoichiro Kawashima, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/728,727

(22) Filed: Dec. 27, 2012

(65) Prior Publication Data

US 2013/0215664 A1  Aug. 22, 2013

(30) Foreign Application Priority Data

Feb. 21, 2012  (JP) ................................. 2012-035376

(51) Int. Cl.
*G11C 8/00* (2006.01)
*G11C 8/18* (2006.01)

(52) U.S. Cl.
USPC ...................... 365/233.14; 365/145; 365/194

(58) Field of Classification Search
USPC .............................. 365/233.14, 145, 195, 196
See application file for complete search history.

(56) References Cited

U.S. PATENT DOCUMENTS

| | | |
|---|---|---|
| 5,864,247 A | 1/1999 | Hirano et al. |
| 5,978,273 A | 11/1999 | Shigemura |
| 6,246,624 B1 | 6/2001 | Hirano et al. |
| 6,538,482 B2 | 3/2003 | Hirano et al. |
| 6,822,493 B2 | 11/2004 | Hirano et al. |
| 6,850,428 B2 | 2/2005 | Kang |
| 6,882,193 B2 | 4/2005 | Hirano et al. |
| 7,038,933 B2 | 5/2006 | Kang |
| 7,221,578 B2 | 5/2007 | Lee et al. |
| 7,936,639 B2 * | 5/2011 | Ba et al. ................... 365/233.14 |
| 2001/0036119 A1 | 11/2001 | Hirano et al. |
| 2003/0122597 A1 | 7/2003 | Hirano et al. |
| 2004/0042253 A1 | 3/2004 | Kang |
| 2004/0169533 A1 | 9/2004 | Hirano et al. |
| 2005/0122829 A1 | 6/2005 | Kang |
| 2005/0168266 A1* | 8/2005 | Shin .............................. 327/536 |
| 2006/0146592 A1 | 7/2006 | Lee et al. |

FOREIGN PATENT DOCUMENTS

| | | |
|---|---|---|
| JP | 10-340591 A | 12/1998 |
| JP | 2004-095136 A | 3/2004 |
| JP | 2006-190460 A | 7/2006 |
| JP | 2006-191655 A | 7/2006 |

* cited by examiner

*Primary Examiner* — Harry W Byrne
*Assistant Examiner* — Lance Reidlinger
(74) *Attorney, Agent, or Firm* — Arent Fox LLP

(57) ABSTRACT

An activate signal generating circuit, to which a first and a second activate signals which are pulse signals are applied, and which generates an internal activate signal, has a first delay element. The internal activate signal is activated based on timings of front (active transient) edges of the first and second activate signals. When a timing of a rear (inactive transient) edge of the first activate signal is earlier than a timing of a rear edge of the second activate signal, the internal activate signal goes inactivate based on the timing of the rear edge of the first activate signal, and when the timing of the rear edge of the first activate signal is later than the timing of the rear edge of the second activate signal, the internal activate signal goes inactivate after a predetermined delay time based on a delay time of the first delay element.

7 Claims, 15 Drawing Sheets

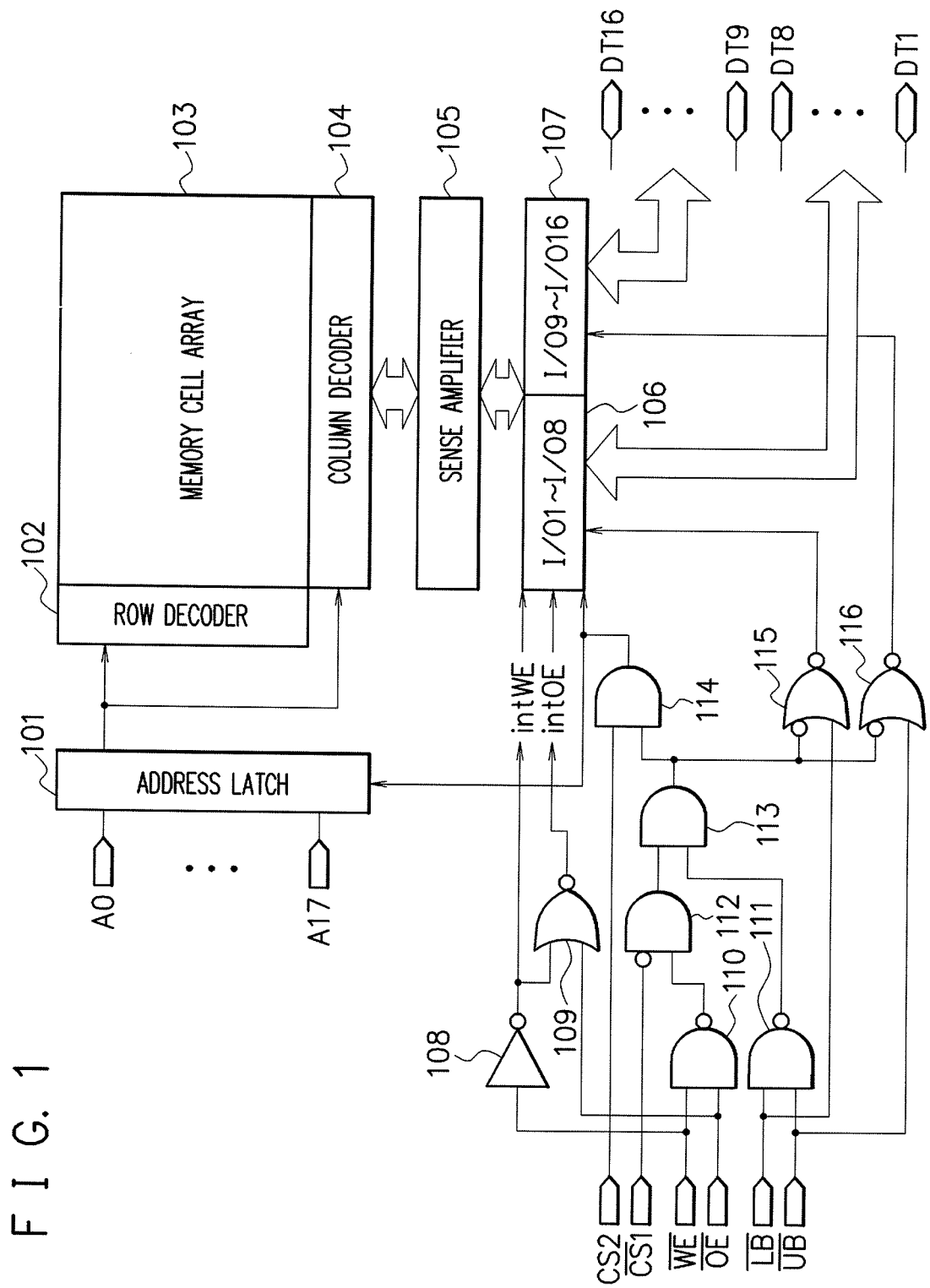
F I G. 1

F I G. 2
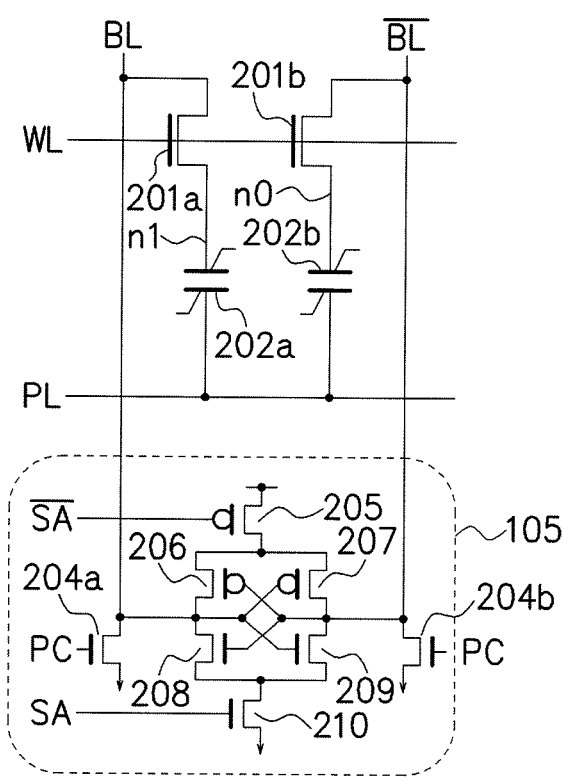

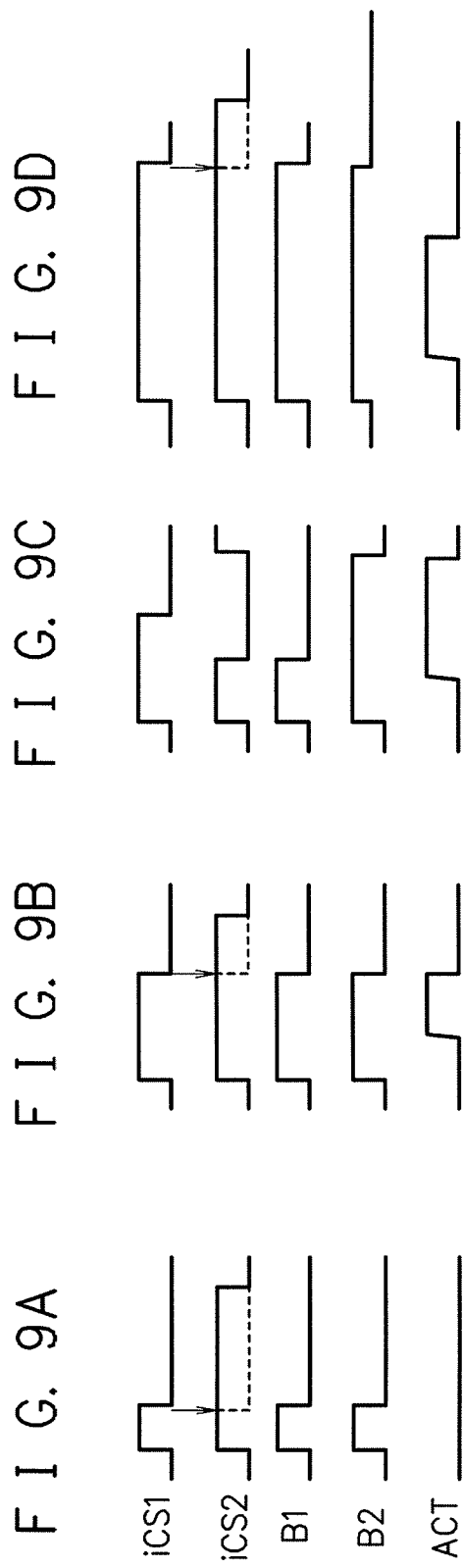

F I G. 11A
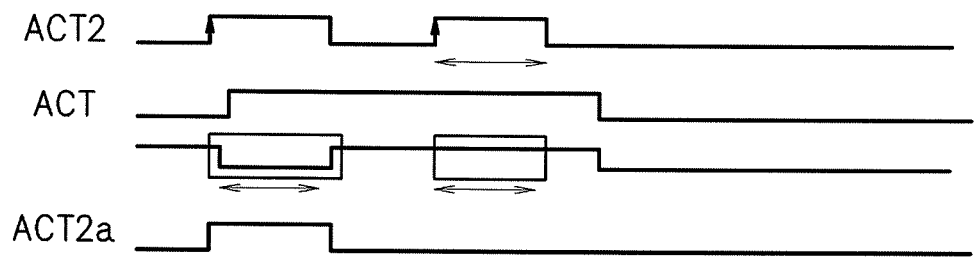
F I G. 11B
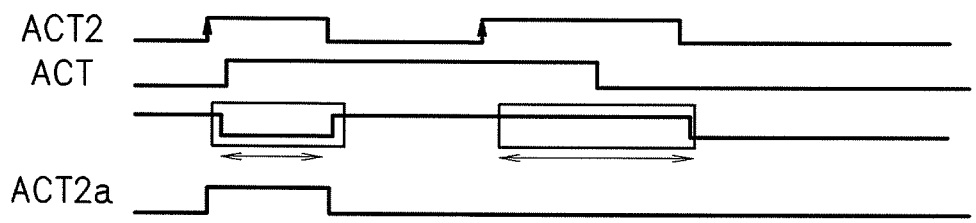
F I G. 11C
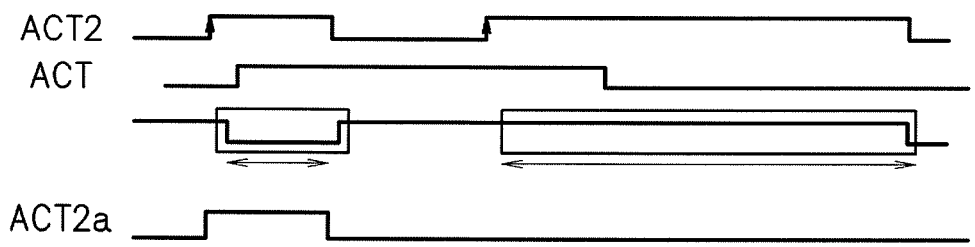

F I G. 12
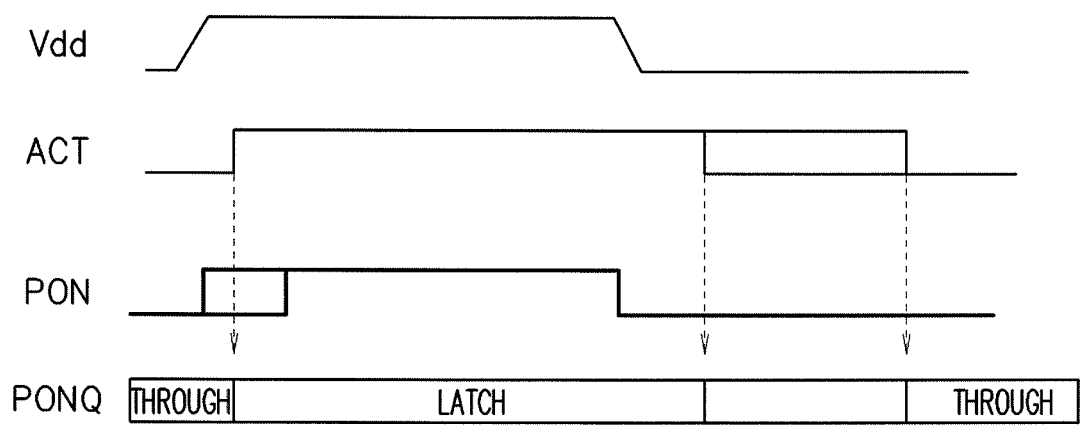

US 8,767,504 B2

ACTIVATE SIGNAL GENERATING CIRCUIT AND SEMICONDUCTOR MEMORY DEVICE

CROSS-REFERENCE TO RELATED APPLICATION

This application is based upon and claims the benefit of priority of the prior Japanese Patent Application No. 2012-035376, filed on Feb. 21, 2012, the entire contents of which are incorporated herein by reference.

FIELD

The embodiment discussed herein is directed to an activate signal generating circuit and a semiconductor memory device.

BACKGROUND

In a capacitive cell type ferroelectric memory, non-volatile data is retained by spontaneous polarization. By applying voltage to the capacitive cell, a small charge is read when the polarity doesn't change, or a large charge is read when the polarity changes. This reading is data destruction reading, and thus the read data is rewritten in a capacitive cell immediately after being read. When the ferroelectric memory is used in a system, an internal signal indicating when the power supply turns on or when the power supply turns off, or a reset signal of the board system, is basically asynchronous, and thus there is a problem of how to prevent data destruction while allowing these asynchronous signals to satisfy memory to go through rewrite synchronization cycles.

Further, there is known a low-voltage detecting means of a non-volatile ferroelectric memory chip including a reset unit which outputs a reset signal which maintains low level up to a certain level of the power supply voltage when the power supply voltage increases from a low voltage to a higher specified voltage, or maintains high level when the power supply voltage is within a standard voltage or when the power supply voltage decreases from the standard voltage to a lower voltage, and a low-voltage detection synchronization circuit which detects a change of the reset signal and the power supply voltage and synchronizes an operation start point and an operation stop point of the non-volatile memory cell with a chip activation signal (see, for example, Patent Document 1).

Further, there is known a power on-off reset circuit which has a first voltage detecting circuit detecting a first voltage and outputting a first signal, and prohibits a new operation sequence to start while continuing a sequence in operation through the end when the power supply voltage is less than or equal to the first voltage (see, for example, Patent Document 2).

Further, there is known a ferroelectric memory device which has a power supply unit for supplying power to a memory device, a power supply detecting circuit detecting a power supply voltage level of the power supply unit and generating a low voltage detection signal according to the power supply voltage level when the power supply is in an off state, and an internal chip enable signal generating circuit (see, for example, Patent Document 3).

Further, there is known a non-volatile semiconductor memory device which has a data storage block having plural non-volatile memory cells and performs writing to these non-volatile memory cells after erasing the non-volatile memory cells in this data storage block (see, for example, Patent Document 4).

Patent Document 1: Japanese Laid-open Patent Publication No. 2004-95136
Patent Document 2: Japanese Laid-open Patent Publication No. 2006-191655
Patent Document 3: Japanese Laid-open Patent Publication No. 2006-190460
Patent Document 4: Japanese Laid-open Patent Publication No. 10-340591

SUMMARY

An activate signal generating circuit, to which a first and a second activate signal which are pulse signals are inputted, and which generates an internal activate signal, has a first delay element, wherein: the internal activate signal is activated based on timings of activate transition edges of the first and second activate signals; when a timing of the inactivate transition edge of the first activate signal is earlier than a timing of the inactive transition edge of the second activate signal, the internal activate signal is inactivated based on the timing of the rear transition edge of the first activate signal; and when the timing of the rear transition edge of the first activate signal is later than the timing of the rear transition edge of the second activate signal, the internal activate signal is inactivated after a predetermined delay time based on a delay time of the first delay element.

The objective and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a structural example of a semiconductor memory device according to an embodiment;

FIG. 2 is a circuit diagram illustrating a structural example of a ferroelectric memory cell and a sense amplifier in a memory cell array of FIG. 1;

FIG. 9A to FIG. 9D are waveform diagrams illustrating an operation example of the activate signal generating circuit of FIG. 8;

FIG. 11A to FIG. 11C are waveform diagrams illustrating signal examples according to an active cycle of an activate signal;

FIG. 12 is a diagram illustrating the activate signal according to a power-on signal;

DESCRIPTION OF EMBODIMENTS

Figure 3:
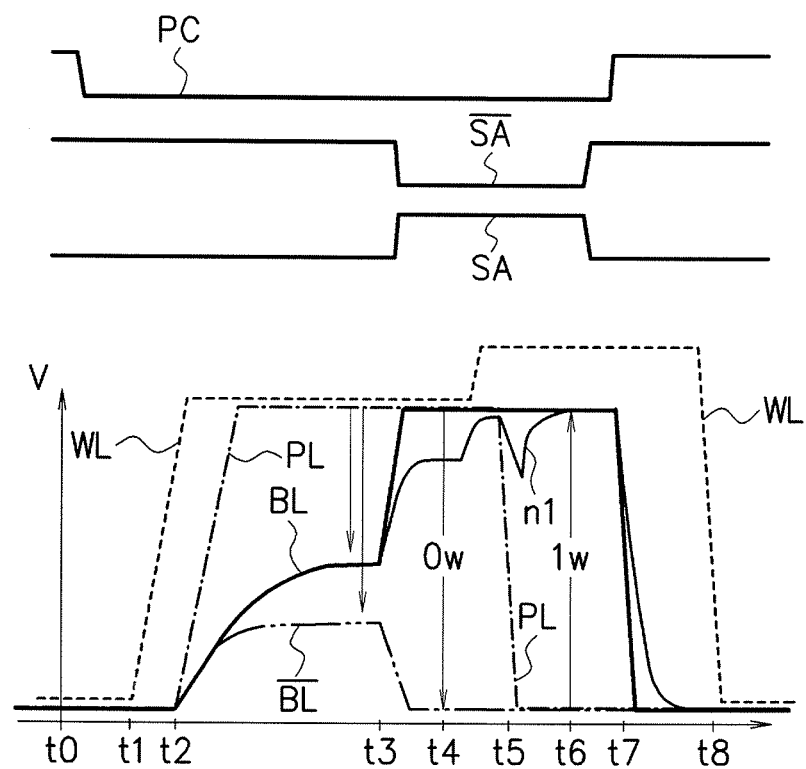
FIG. 3 is a diagram illustrating a voltage waveform example of a read operation of a circuit of FIG. 2.

FIG. 1 is a diagram illustrating a structural example of a semiconductor memory device according to an embodiment. The semiconductor memory device is a ferroelectric memory device for example. An inverter 108 outputs a logical inversion signal of a write enable signal /WE as an internal write enable signal intWE to input and output buffers 106 and 107. A negative logical sum (NOR) circuit 109 outputs a negative logical sum signal of the internal write enable signal intWE and an output enable signal /OE as an internal output enable signal intOE to the input and output buffers 106 and 107. A negative logical product (NAND) circuit 110 outputs a negative logical product signal of the write enable signal /WE and the output enable signal /OE. A negative logical product circuit 111 outputs a negative logical product signal of a lower byte mask signal /LB which is a positive logic and an upper byte mask signal /UB which is a positive logic. A logical product (AND) circuit 112 outputs a logical product signal of the output signal of the negative logical product circuit 110 and a logical inversion signal of a first chip select signal /CS1. A logical product circuit 113 outputs a logical product signal of the output signal of the logical product circuit 112 and the output signal of the negative logical product circuit 111. A logical product circuit 114 outputs a logical product signal of the output signal of the logical product circuit 113 and a second chip select signal CS2 to an address latch 101 and the input and output buffers 106, 107. A negative logical sum (NOR) circuit 115 outputs a negative logical sum signal of a logical inversion signal of the output signal of the logical product circuit 113 and the lower byte mask signal /LB to the lower byte input and output buffer 106. A negative logical sum circuit 116 outputs a negative logical sum signal of the logical inversion signal of the output signal of the logical product circuit 113 and the upper byte mask signal /UB to the upper byte input and output buffer 107.

The address latch 101 latches addresses A0 to A17, and outputs them to a row decoder 102 and a column decoder 104. The addresses A0 to A17 include plurality of row and column addresses. The lower byte input and output buffer 106 receives and outputs lower byte data DT1 to DT8 from and to the outside. The upper byte input and output buffer 107 receives and outputs upper byte data DT9 to DT16 from and to the outside. Specifically, the input and output buffers 106 and 107 receives the data DT1 to DT16 to be written to a memory cell array 103 and outputs the data DT1 to DT16 read from the memory cell array 103.

The memory cell array 103 has plural ferroelectric memory cells arranged in a two-dimensional matrix form and stores data of respective addresses. Each of the ferroelectric memory cells is identified by selecting a word line, a plate line, and a bit line. The row decoder 102 selects a word line and a plate line corresponding to a row address. The column decoder 104 selects a bit line corresponding to a column address. A sense amplifier 105 amplifies data inputted from the input and output buffers 106, 107 and outputs the amplified data to the memory cell array 103 via the column decoder 104. When write cycle is asserted with the external control signal inputs, data are written in the ferroelectric memory cell of the selected word line and bit line in the memory cell array 103. Further, when a read cycle is asserted, data are read from the ferroelectric memory cell 103 of the selected word line and bit lines in the memory cell array 103. The sense amplifiers 105 amplify the read data and output the amplified data to the input and output buffers 106 and 107.

FIG. 2 is a circuit diagram illustrating a structural example of a ferroelectric memory cell and the sense amplifier 105 in the memory cell array 103 of FIG. 1. The ferroelectric memory cell is a non-volatile memory element having n-channel field effect transistors 201a, 201b and ferroelectric capacitors 202a, 202b. The n-channel field effect transistor 201a has a drain connected to a bit line BL, a gate connected to a word line WL, and a source connected to a node n1. The ferroelectric capacitor 202a is connected between the node n1 and a plate line PL. The n-channel field effect transistor 201b has a drain connected to a bit line /BL, a gate connected to the word line WL, and a source connected to a node n0. The ferroelectric capacitor 202b is connected between the node n0 and the plate line PL.

The sense amplifier 105 has p-channel field effect transistors 205 to 207, and n-channel field effect transistors 204a, 204b, 208 to 210. A sense amplifier activate signal /SA is inputted to a gate of the p-channel field effect transistor 205, and a sense amplifier activate signal SA is inputted to a gate of the n-channel field effect transistor 210. The n-channel field effect transistor 204a has a gate connected to a node of a precharge activate signal PC and a drain connected to the bit line BL. The n-channel field effect transistor 204b has a gate connected to a node of the precharge activate signal PC and a drain connected to the bit line /BL. A source of the n-channel field effect transistor 204a and a source of the n-channel field effect transistor 204b are connected to a ground potential node.

Figure 4:
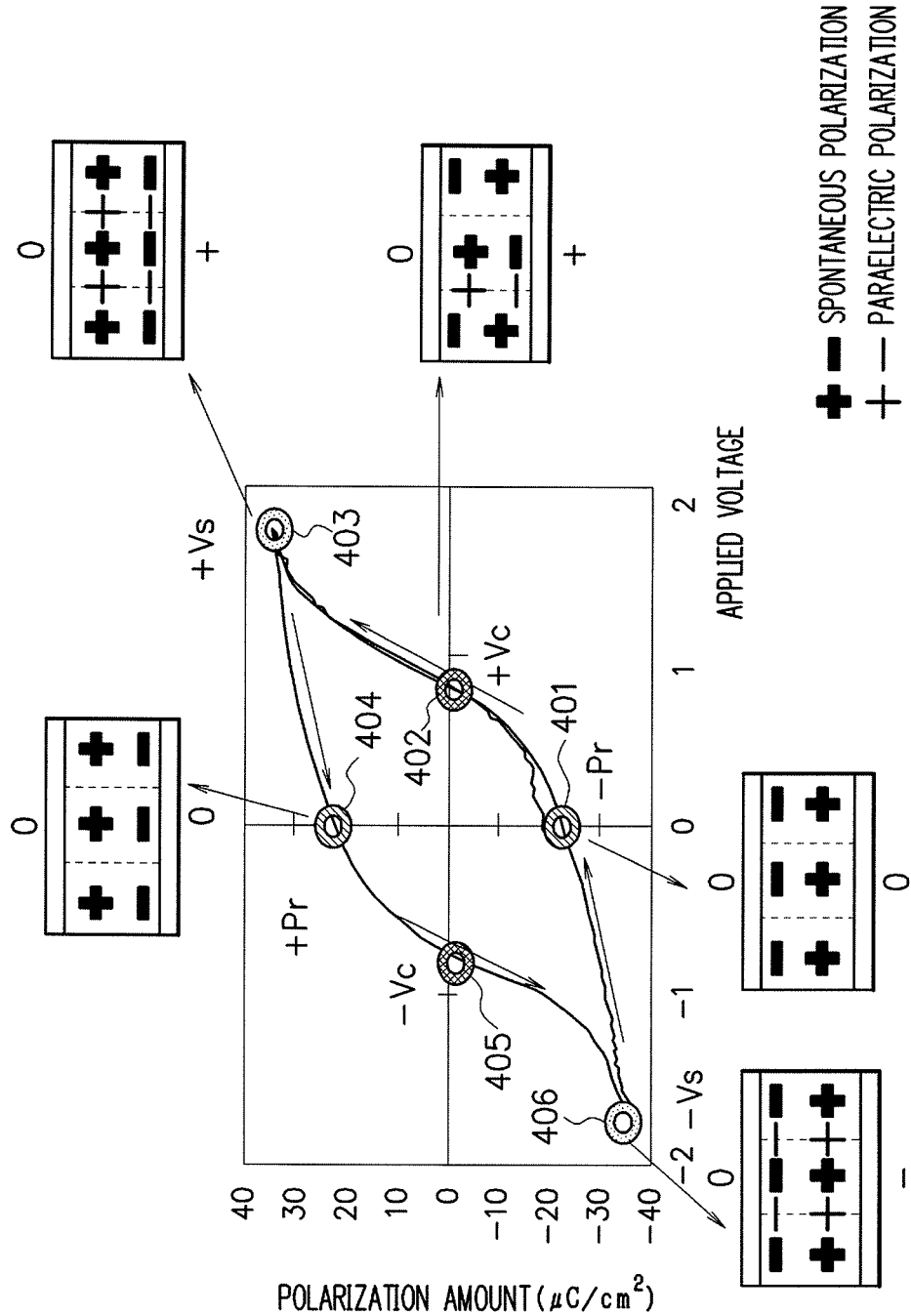
FIG. 4 is a diagram illustrating hysteresis characteristics of ferroelectric capacitors of FIG. 2.

FIG. 3 is a diagram illustrating an example of a read operation voltage waveforms of the circuit of FIG. 2, and FIG. 4 is a diagram illustrating hysteresis characteristics of the ferroelectric capacitors 202a, 202b of FIG. 2. In FIG. 4, the horizontal axis represents an applied voltage, the vertical axis represents a residual polarization amount, polarization amounts +Pr and −Pr are residual polarization amounts, voltages +Vc and −Vc are coercive voltages, and voltages +Vs and −Vs are saturation voltages. The ferroelectric capacitors 202a, 202b has a hysteresis characteristic which passes points 401 to 406. For example, the ferroelectric capacitor 202a stores data "1" corresponding to the point 401, and the ferroelectric capacitor 202b stores data "0" corresponding to the point 404.

In FIG. 3, first, before time t0, the word line WL and the plate line PL are at low level. The ferroelectric capacitors 202a and 202b are disconnected from the bit lines BL and /BL, respectively. The sense amplifier activate signal SA is at low level, and the sense amplifier activate signal /SA is at high level. The transistors 205 and 210 are off, and the sense amplifier 105 is inactivated. The precharge activate signal PC is at high level, the transistors 204a and 204b are on, and the bit lines BL and /BL are precharged to low level (GND).

Next, after time t0, the precharge activate signal PC becomes low level, the transistors 204a and 204b turn off, and the precharge period finishes.

Next, at time t1, the word line WL becomes high level, and the transistors 201a and 201b turn on.

Next, at time t2, the plate line PL becomes high level. Then, the ferroelectric capacitor 202a outputs a higher voltage to the bit line BL since the polarity of the capacitor switches by applying PL voltage level (go through 401 402 403), and the ferroelectric capacitor 202b outputs a lower voltage to the bit line /BL since the polarity of the capacitor remains same (go through 404 to 403). By this reading operation, as illustrated by the hysteresis characteristics in FIG. 4, the stored data in the ferroelectric capacitors 202a and 202b are destroyed (both at 403). Then, rewriting of data in the ferroelectric capacitors 202a and 202b is performed thereafter.

At time t3, the sense amplifier activate signal SA becomes high level, and the sense amplifier activate signal /SA becomes low level. Then, the transistors 205 and 210 turn on, and the sense amplifier 105 is activated. The sense amplifier 105 amplifies the higher voltage of the bit line BL to high level (VDD), and amplifies the lower voltage on the bit line /BL to low level (GND). The bit lines BL and /BL are amplified to CMOS level full swing signals. The data of these amplified bit lines BL and /BL are outputted as read data to the outside.

Next, at time t4, a positive voltage is applied to a plate line PL with reference to the voltage of the bit line /BL, and thus the data "0" is rewritten to the ferroelectric capacitor 202b (at point 403). And also WL level is boosted so as to supply n1 node high level equal to VDD.

Next, at time t5, the plate line PL becomes low level.

Next, at time t6, a negative voltage is applied to the plate line PL with reference to the voltage of the bit line BL, and thus the data "1" is rewritten to the ferroelectric capacitor 202a (at point 406).

Next, at time t7, the sense amplifier activate signal SA becomes low level, the sense amplifier activate signal /SA becomes high level, and the precharge activate signal PC becomes high level. The bit lines BL and /BL are precharged to a low level (GND) potential.

Next, at time t8, the word line WL becomes low level, and the transistors 201a and 201b turn off.

As described above, since the reading operation of the ferroelectric memory cell is data destruction reading, it is necessary to rewrite data after the reading operation. Therefore, it is necessary to avoid a state that, the chip select signal /CS1 or CS2 of FIG. 1 is inactivated in middle (t2 to t7) of the reading operation of data, in which rewriting is not performed after the data destruction reading.

Figure 5:
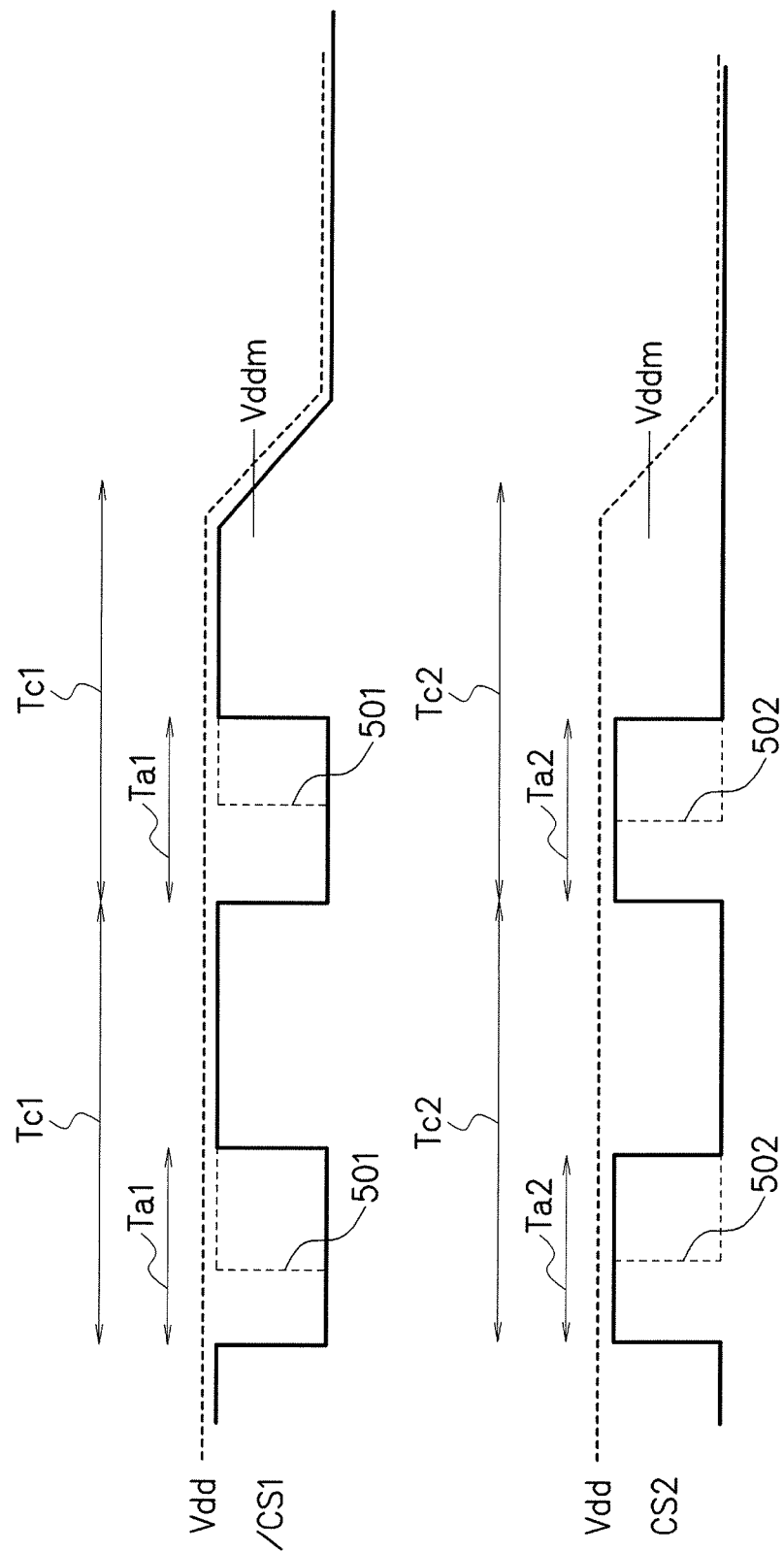
FIG. 5 is a diagram illustrating ordinary regulations of falling of chip select signals and power supply voltage.

FIG. 5 is a diagram illustrating ordinary pulse width regulations of the chip select signals /CS1, and CS2 on falling of the power supply voltage Vdd. It is necessary that the first chip select signal /CS1 satisfies an active cycle Tc1 and the second chip select signal CS2 satisfies an active cycle Tc2. Basically, the active cycle Tc1 and the active cycle Tc2 have same period. If they are not satisfied, when the power supply voltage Vdd falls before finishing rewriting data and becomes lower than a minimum power supply voltage Vddm, it becomes a state that the rewriting is not completed with applying insufficient voltage to the ferroelectric capacitors 202a and 202b. In this case, data destruction occurs. Note that when the first chip select signal /CS1 activate the memory by falling and with low level, the second chip select signal CS2 activate by rising and with high level, and the internal circuit is activated, although the first chip select signal /CS1 is a signal 501 which does not satisfy a regulation of active period Ta1 and the second chip select signal CS2 is a signal 502 which does not satisfy a regulation of active period Ta2, the data destruction can be prevented by introducing a means of let the internal circuit continuing the processing and complete through rewriting.

Figure 6:
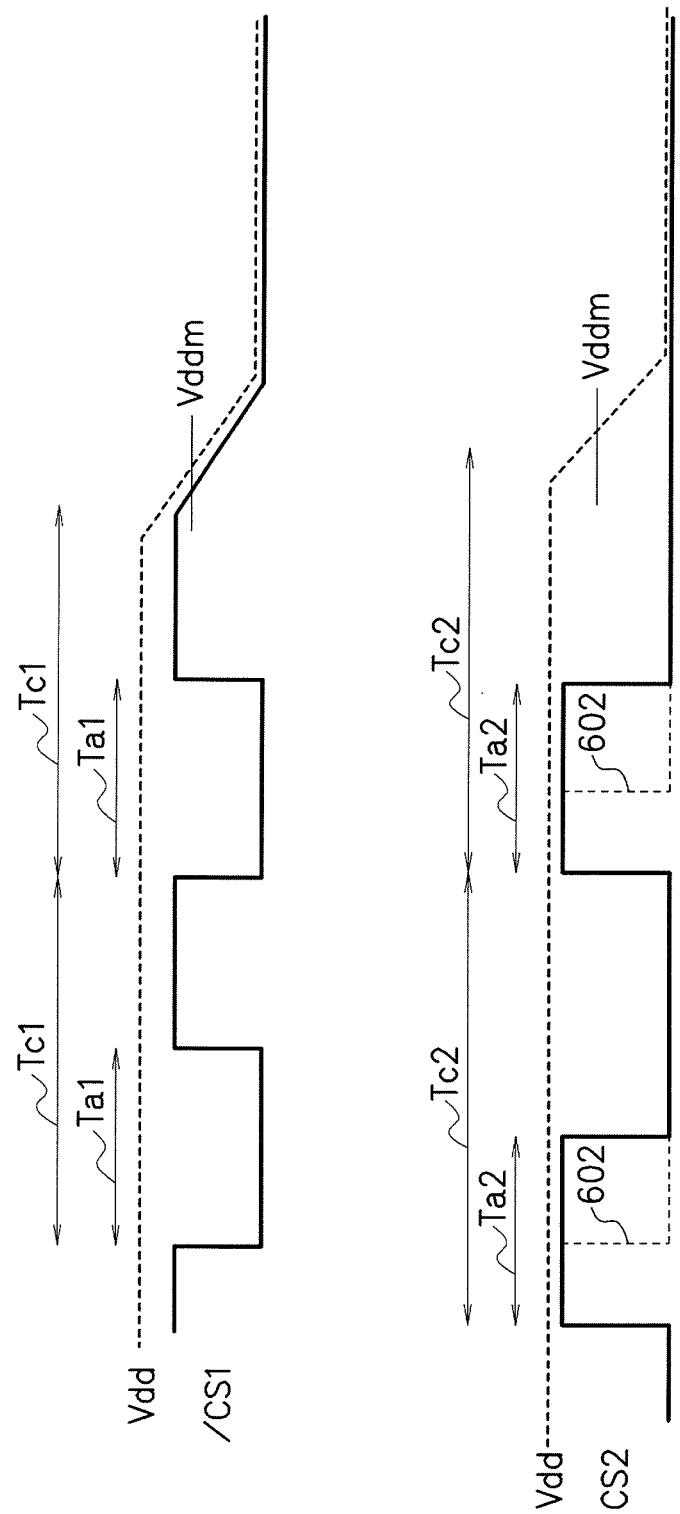
FIG. 6 is a diagram illustrating regulations of falling of chip select signals and power supply voltage according to this embodiment.

FIG. 6 is a diagram illustrating pulse width regulations of the chip select signals /CS1 and CS2 on falling of the power supply voltage Vdd according to this embodiment. The first chip select signal /CS1 enables an immediate active period termination for achieving fast cycles. However, the first chip select signal /CS1 may satisfy the active period Ta1 and the active cycle Tc1, and be strictly synchronous. If they are not satisfied, or when the power supply voltage Vdd falls without finishing rewriting data, it becomes a state that the writing is not performed with applying a sufficient voltage to the ferroelectric capacitors 202a and 202b. In this case, data destruction occurs. The second chip select signal CS2 generates an internal chip select signal which satisfies the active period Ta2 and the active cycle Tc2 with its rising edge being a trigger. Therefore, when the second chip select signal CS2 was a signal 602 which did not satisfy the active period Ta2, an internal chip select signal which satisfies the active period Ta2 is internally generated. However, internal delay timing is not so stable with temperature and supply voltage variation as external clock, there may be some margin added to catalog specification Ta2 and Tc2, so they are longer than Ta1 and Tc1 respectively.

In order to achieve fast cycles even when there were environmental variations of temperature and supply voltage, operation is started by a falling edge of the first chip select signal /CS1 in which the outside stable clock drives and there is almost no cycle or timing variation to the environment, and the activate period is immediately terminated by the rising edge. However, the first chip select signal /CS1 does not generate self-propelled internal activate signal, and thus minimum regulations of a low level period (active period) and a high level period (precharge period) are necessary to be provided. Forced termination (external controlled timing termination) is also possible for the active cycle by starting with second chip select signal CS2, but since making the second chip select signal CS2 to generate internal activate signal an asynchronous, self-propelled type thus employing a mean to allowing selective switching between fast cycle operation of forced termination and asynchronous, self-propelled type, by using CS2 control input, it is possible to achieve operation which does not cause data destruction. The semiconductor memory device is used in a system which utilizes this non-volatility, and thus data destruction needs to be prevented even when a restriction on the first chip select signal /CS1 and prohibition restrictions on turning on and off the power supply are broken unintentionally.

Figure 7:
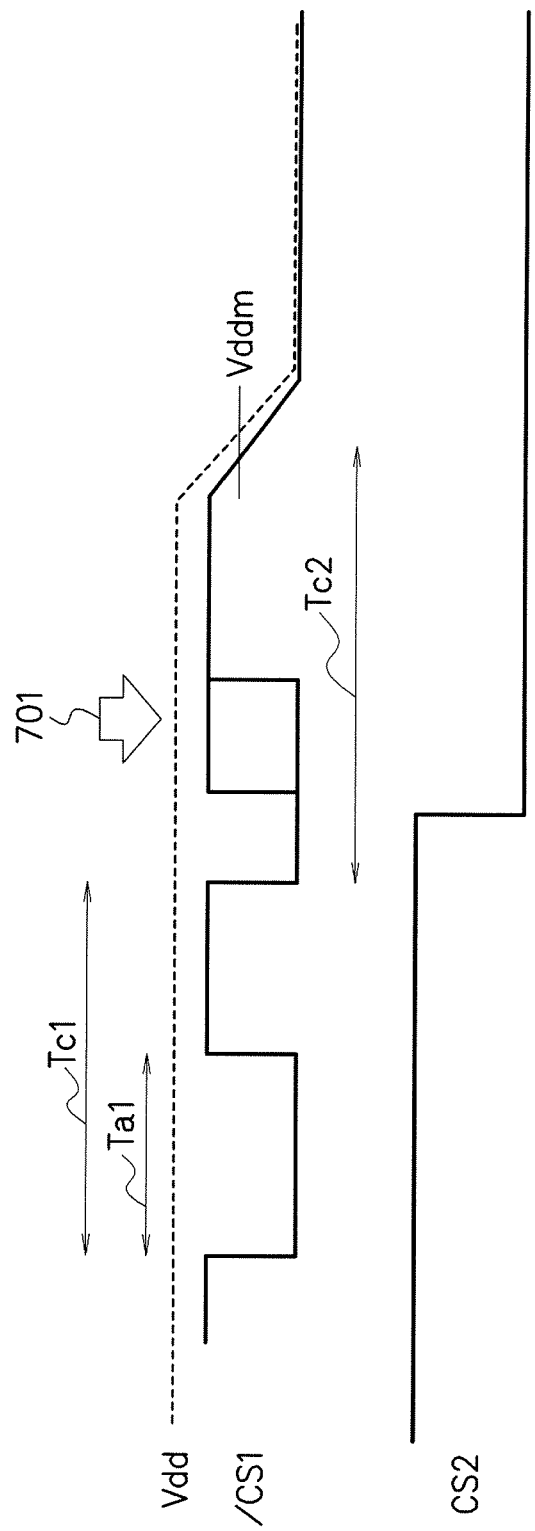
FIG. 7 is a diagram illustrating regulations of falling of the chip select signals and the power supply voltage according to this embodiment.

FIG. 7 is a diagram illustrating a relaxing regulation of combination of /CS1 and CS2 on falling of the power supply voltage Vdd when the active cycle Tc1 is started by the first chip select signal /CS1 of this embodiment, and the active cycle Tc2 is finished based on the second chip select signal CS2. When the second chip select signal CS2 becomes low level by an external system reset, even if a rising edge 701 of the first chip select signal /CS1 does not satisfy the active period (low level) Ta1, an internal activate signal is generated so as to satisfy the active cycle Tc2 of the second chip select signal CS2. Thus, the internal activate signal maintains its activated state until the data rewriting finishes, and thus data destruction does not occur. Note that independent operation of the first chip select signal /CS1 with the second chip select signal CS2 being high level enables fast operation of the active cycle Tc1 to achieve a minimum cycle.

Figure 8:
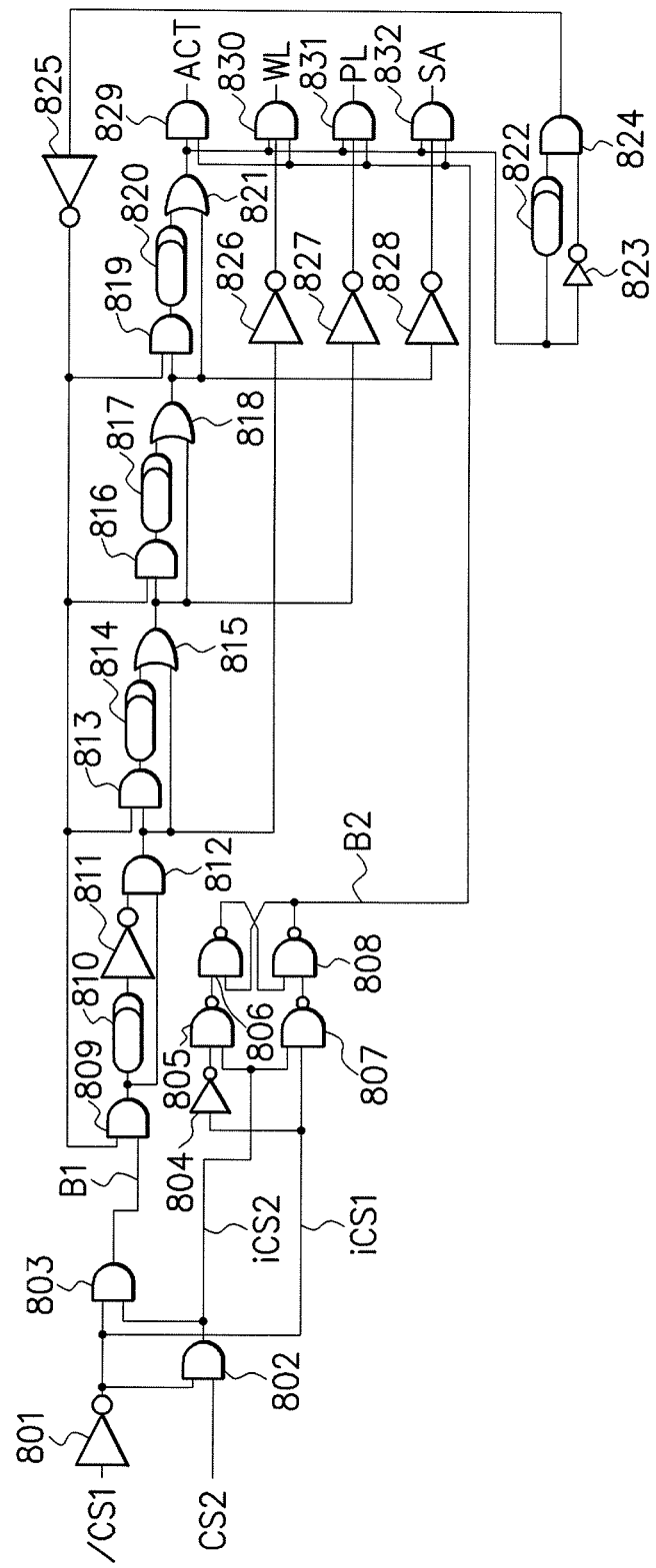
FIG. 8 is a circuit diagram illustrating a structural example of an activate signal generating circuit.

The first chip select signal /CS1 is a first activate input signal, and the second chip select signal CS2 is a second activate input signal. An activate signal generating circuit activates the internal activate signal based on timings of later asserting transition edges (front edges) of the first activate signal /CS1 and the second activate signal CS2. Further, when a timing of a disserting transition edge (rear edge) of the first activate signal /CS1 is earlier than a timing of a disserting transition edge (rear edge) of the second activate signal CS2, the activate signal generating circuit inactivates the internal activate signal immediately based on the timing of the rear edge of the first activate signal /CS1. Further, when the timing of the rear edge of the first activate signal /CS1 is later than the timing of the rear edge of the second activate signal CS2, it switches to self-timing mode and the activate signal generating circuit inactivates the internal activate signal after a predetermined delay time based on delay times of first delay elements 814, 817, and 820 (FIG. 8). Thus an irregular short period of /CS1 negative pulse causes no data destruction with the help of earlier CS2 transition to inactive (low level).

FIG. 8 is a circuit diagram illustrating a structural example of the activate signal generating circuit, and FIG. 9A to FIG. 9D are waveform diagrams illustrating an operation example of the activate signal generating circuit of FIG. 8. The activate signal generating circuit receives the first chip select signal /CS1 and the second chip select signal CS2 which are pulse signals, and generates an internal activate timing signal ACT, a timing signal of the word line WL, a timing signal of the plate line PL, and the sense amplifier activate timing signal SA. The first chip select signal /CS1 is a first activate signal, and the second chip select signal CS2 is a second activate signal. An inverter 801 outputs a logical inversion signal of the first chip select signal /CS1 as a first internal chip select signal iCS1. A logical product circuit 802 outputs a logical product signal of the first internal chip select signal iCS1 and the second chip select signal CS2 as a second internal chip select signal iCS2. A logical product circuit 803 outputs a logical product signal B1 of the first internal chip select signal iCS1 and the second internal chip select signal iCS2.

An inverter 804 outputs a logical inversion signal of the first internal chip select signal iCS1. A negative logical product circuit 805 outputs a negative logical product signal of the output signal of the inverter 804 and the second internal chip select signal iCS2. A negative logical product circuit 807 outputs a negative logical product signal of the first internal chip select signal iCS1 and the second internal chip select signal iCS2. A negative logical product circuit 806 outputs a negative logical product signal of the output signals of the negative logical product circuits 805 and 808. A negative logical product circuit 808 outputs a negative logical product signal of the output signals of the negative logical product circuits 806 and 807 as a signal B2.

A logical product circuit 809 outputs a logical product signal of an output signal of an inverter 825 and the signal B1. A delay element 810 outputs a signal obtained by delaying the output signal of the logical product circuit 809. An inverter 811 outputs a logical inversion signal of the output signal of the delay element 810. A logical product circuit 812 outputs a logical product signal of the output signal of the inverter 811 and the output signal of the logical product circuit 809. A logical product circuit 813 outputs a logical product signal of the output signal of the inverter 825 and the output signal of the logical product circuit 812. A delay element 814 outputs a signal obtained by delaying the output signal of the logical product circuit 813. A logical sum (OR) circuit 815 outputs a logical sum signal of the output signal of the delay element 814 and the output signal of the logical product circuit 812. A logical product circuit 816 outputs a logical product signal of the output signal of the inverter 825 and the output signal of the logical sum circuit 815. A delay element 817 outputs a signal obtained by delaying the output signal of the logical product circuit 816. A logical sum circuit 818 outputs a logical sum signal of the output signal of the delay element 817 and the output signal of the logical sum circuit 815. A logical product circuit 819 outputs a logical product signal of the output signal of the inverter 825 and the output signal of the logical sum circuit 818. A delay element 820 outputs a signal obtained by delaying the output signal of the logical product circuit 819. A logical sum circuit 821 outputs a logical sum signal of the output signal of the delay element 820 and the output signal of the logical sum circuit 818.

A delay element 822 outputs a signal obtained by delaying the output signal of the logical sum circuit 821. An inverter 823 outputs a logical inversion signal of the output signal of the logical sum circuit 821. A logical product circuit 824 outputs a logical product signal of the output signal of the delay element 822 and the output signal of the inverter 823. The inverter 825 outputs a logical inversion signal of the output signal of the logical product circuit 824.

An inverter 826 outputs a logical inversion signal of the output signal of the logical product circuit 812. An inverter 827 outputs a logical inversion signal of the output signal of the logical sum circuit 815. An inverter 828 outputs a logical inversion signal of the output signal of the logical sum circuit 818.

A logical product circuit 829 outputs a logical product signal of the output signal of the logical sum circuit 821 and the signal B2 as the internal activate timing signal ACT. A logical product circuit 830 outputs a logical product signal of the output signal of the logical sum circuit 821, the output signal of the inverter 826, and the signal B2 as a timing signal of the word line WL. A logical product circuit 831 outputs a logical product signal of the output signal of the logical sum circuit 821, the output signal of the inverter 827, and the signal B2 as a timing signal of the plate line PL. A logical product circuit 832 outputs a logical product signal of the output signal of the logical sum circuit 821, the output signal of the inverter 828, and the signal B2 as the sense amplifier activate timing signal SA. Examples of these signals will be described later with reference to FIG. 10A to FIG. 10D.

The signal B1 is a logical product signal of the first internal chip select signal iCS1 and the second internal chip select signal iCS2. The second delay element 810 is a pulse width compressing circuit which deletes the signal B1 with a short pulse as illustrated in FIG. 9A. Accordingly, in a rising edge of the internal activate signal ACT, a delay occurs with respect to rising edges of the internal chip select signals iCS1 and iCS2.

The delay elements 814, 817, and 820 are first delay elements, and the delay element 810 is a second delay element. The delay time of the second delay element 810 is set to a time based on a delay time from when the first chip select signal /CS1 or the second chip select signal CS2 is asserted until when the plate line PL of FIG. 2 starts to rise.

As illustrated in FIG. 9B to FIG. 9D, when a time from timings of asserting edges (front edges) of the first chip select signal /CS1 and the second chip select signal CS2 to the timing of a disserting edge (rear edge) of the first chip select signal /CS1 is longer than the time based on the delay time of the second delay element 810, the activate signal generating circuit activates the internal activate signal ACT after a predetermined delay time based on the delay time of the second delay element 810 from the timings of the front edges of the first chip select signal /CS1 and the second chip select signal CS2.

Further, as illustrated in FIG. 9A, when the time from timings of the front edges of the first chip select signal /CS1 and the second chip select signal CS2 to the timing of the rear edge of the first chip select signal /CS1 is shorter than the time based on the delay time of the second delay element 810, the activate signal generating circuit leaves the internal activate timing signal ACT inactive.

The negative logical product circuits 805 to 808 form a latch circuit and output the signal B2. As illustrated in FIGS. 9A, 9B, and 9D, when the first internal chip select signal iCS1 becomes low level earlier than the second internal chip select signal iCS2, the signal B2 also becomes low level. Specifically, in a period in which the second internal activate signal iCS2 is at high level, when the first internal activate signal iCS1 changes to low level, the signal B2 becomes low level according to the first internal chip select signal iCS1 because the latch circuit is in a through state. When the signal B2 becomes low level, the internal activate timing signal ACT, the timing signal of the word line WL, the timing signal of the plate line PL, and the sense amplifier activate timing signal SA become low level by the logical product circuits 829 to 832, and this results in a forced termination corresponding with the end edge (rising edge) of the external /CS1 input signal as is illustrated in FIG. 9B.

As illustrated in FIG. 9C, when the second internal chip select signal 10S2 changes to low level earlier than the first internal chip select signal iCS1, the latch circuit (composed with 805 to 808) latches the high level of the first internal chip select signal iCS1 and outputs the signal B2 at high level. Then, until the inverter 825 outputs low level, the internal activate signal ACT, the timing signal of the word line WL, the timing signal of the plate line PL, and the sense amplifier activate timing signal SA maintain high level.

Each of the first delay elements 814, 817, and 820 is a pulse width extending circuit. The delay element 822, the inverter 823, and the logical product circuit 824 are a detecting circuit for a pulse falling edge, and output a positive short pulse at the time of falling edge. The inverter 825 outputs a logical inversion signal of this positive short pulse as a negative short pulse. The logical product circuits 809, 813, 816, and 819 receive the output signal of the inverter 825 for resetting delay pulse wave components. The logical sum circuits 815, 818, and 821 output the sum of the output signals of the respective delay elements 814, 817, and 820, and pre-delay signals for enlarging positive pulse width thus finally determine the timing of a falling edge of the internal activate timing signal ACT.

FIG. 9A illustrates the case of protection mode where the first internal chip select signal iCS1 has a short pulse width and the internal activate timing signal ACT does not go active. FIG. 9B illustrates the case of /CS1 controlled mode where the internal activate timing signal ACT falls according to the falling edge of the first internal chip select signal iCS1. FIG. 9C illustrates the case of self-timing mode where the internal activate timing signal ACT operates for a predetermined fix pulse width. FIG. 9D illustrates the case of time-out mode where the internal activate timing signal ACT operates for the predetermined fix pulse width because the high level periods (active periods) of the internal chip select signals iCS1 and iCS2 are long enough.

The activate signal generating circuit activates the internal activate timing signal ACT based on the timings of the asserting edges (front edges) of the first chip select signal /CS1 and the second chip select signal CS2.

Further, as illustrated in FIG. 9B, when the timing of the disserting edge (rear edge) of the first chip select signal /CS1 is earlier than the timing of the disserting edge (rear edge) of the second chip select signal CS2, the activate signal generating circuit inactivates the internal activate timing signal ACT based on the timing of the disserting edge (rear edge) of the first chip select signal /CS1.

Further, as illustrated in FIG. 9C, when the timing of the rear edge of the first chip select signal /CS1 is later than the timing of the rear edge of the second chip select signal CS2, it operates as self-timing mode and the activate signal generating circuit inactivates the internal activate timing signal ACT after a predetermined delay time based on the delay times of the first delay elements 814, 817, and 820. The delay times of the first delay elements 814, 817, and 820 are set based on a time in which the first chip select signal /CS1 or the second chip select signal CS2 is asserted and the plate line PL of FIG. 2 goes high level, data of the memory cell (non-volatile memory element) is latched by the sense amplifier 105, then the plate line PL goes low level, and both 0 and 1 data are rewritten in the memory cell (non-volatile memory element), i.e. the cycle of the sequence in FIG. 3 completes.

Figure 10A:
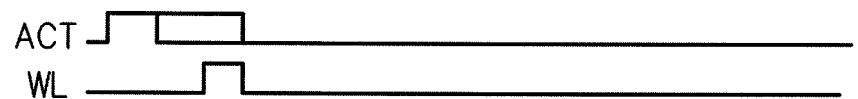
FIG. 10A to FIG. 10D are waveform diagrams illustrating signal examples according to pulse widths of the chip select signals.
Figure 10B:
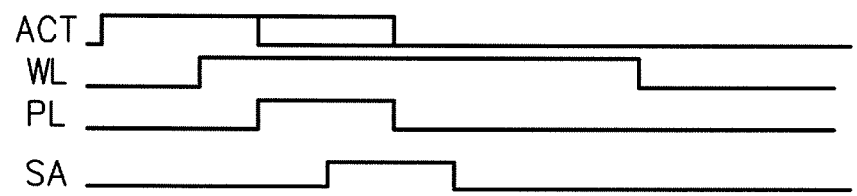
Figure 10C:
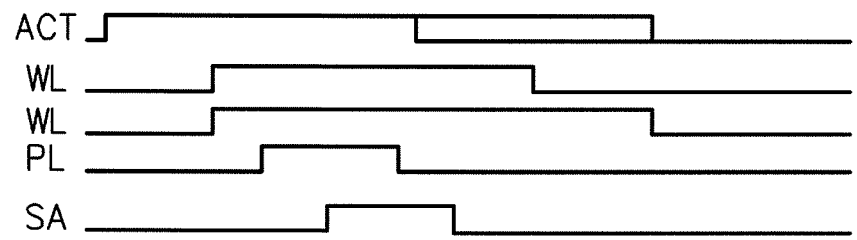
Figure 10D:
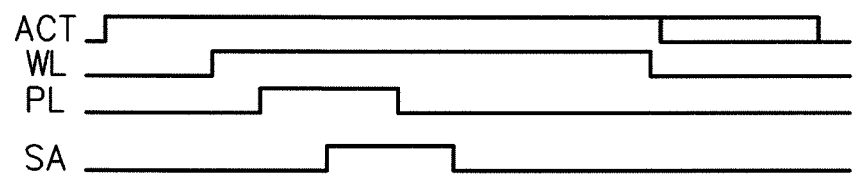

FIG. 10A to FIG. 10D are waveform diagrams illustrating signal examples according to pulse widths of the chip select signals /CS1 and CS2. Briefly, FIG. 10A for too short period of activate pulse, the PL is not moved. FIG. 10B for activate pulse longer than after PL raising timing, it enters self-timing mode thus reserves rewrite "1" period, then WL goes low. FIG. 10C for normal recommended timing activate pulse width, minimum delay for PL fall to WL fall that is rewrite "1" period is maintained. WL pulse width varies with applied ACT pulse width and the case exhibits the shortest cycle time. FIG. 10D for longer activate pulse width, the self-timing force automatically WL to fall because sufficiently long "1" rewrite timing is given.

FIG. 10A illustrates the case where the pulse widths of the chip select signal /CS1 is less than 20 ns. When the pulse widths of the chip select signal /CS1 is less than 20 ns, the timing signal of the word line WL becomes high level. However, as long as the timing signal of the plate line PL does not become high level, the first internal chip select signal iCS1 can return low level immediately after the chip select signal /CS is disserted, and thus the timing signal of the plate line PL and the sense amplifier activate timing signal SA does not become high level. Since the plate line PL does not become high level, data reading is not performed even if a read cycle is asserted with the external control signals with shorter than proper read and restore sequence cycle, and thus data destruction does not occur.

FIG. 10B illustrates the case where the pulse widths of the chip select signal /CS1 is 20 ns to 40 ns. When the pulse widths of the chip select signal /CS1 is 20 ns to 40 ns, the timing signals of the word line WL and the plate line PL become high level. When the first internal chip select signal iCS1 changes to low level in a period in which the plate line PL is at high level, the high levels of the internal activate signal ACT, the timing signals of word line WL and the plate line PL, and the sense amplifier activate timing signal SA are operated with self-timing mode. Thus, reading of data and rewriting of data is performed properly, and data destruction does not occur.

FIG. 10C illustrates the case where the pulse widths of the chip select signal /CS1 is 40 ns to 100 ns. When the pulse widths of the chip select signal /CS1 is 40 ns to 100 ns, the timing signals of the word line WL and the plate line PL and the sense amplifier activate signal SA emit positive pulses. When the first chip select signal /CS1 changes to high level after the timing signal of plate line PL goes low level, the timing signal of the word line WL falls after necessary "1" rewrite timing has over according to the rising edge of the first chip select signal /CS1 similarly to the signal of the timing signal of word line WL on an upper side. Further, when the first chip select signal /CS1 becomes high level after the timing signal of plate line PL goes low level and necessary "1" rewrite timing has over, the timing signal of the word line WL falls immediately, similarly to the timing signal of the word line WL on a lower side after the active period. Thus, reading of data and rewriting of data is performed properly, and data destruction does not occur.

FIG. 10D illustrates the case where the pulse width of the chip select signal /CS1 is longer than 100 ns. When the pulse width of the chip select signal /CS1 is longer than 100 ns, the timing signals of the word line WL and the plate line PL and the sense amplifier activate timing signal SA pulse are according to self-timing, and the timing signal of the word line WL goes low independent to how /CS1 assert period is long Thus, reading of data and rewriting of data is performed properly, and data destruction does not occur.

Figure 13:
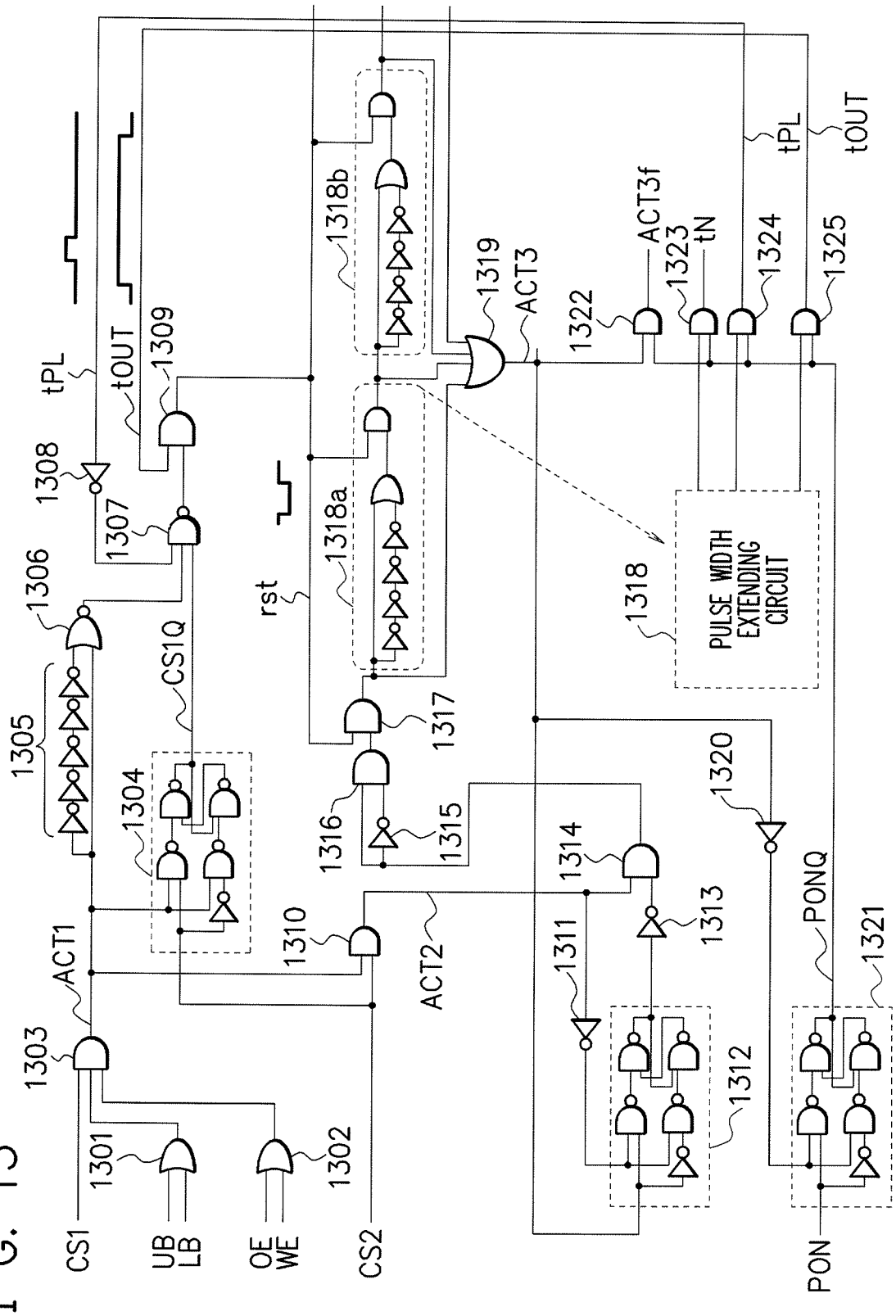
FIG. 13 is a circuit diagram illustrating a structural example of the activate signal generating circuit for generating the signals of FIG. 10A to FIG. 10D, FIG. 11A to FIG. 11C, and FIG. 12.

FIG. 11A to FIG. 11C are waveform diagrams illustrating signal examples according to an active cycle of an activate signal ACT2 in terms of protect data from minimum cycle violation. Because CS2 active cycle is made edge trigger and self-timing, re-trigger protect method shall be described. When the next activate signal ACT2 (generated from CS2) is activated at an interval shorter than a prescribed self-timing active cycle (ACT), this second activate transition is ignored and is reshaped to ACT2a thereby prevent data destruction. The activate signal ACT2 is, as illustrated in FIG. 13, a signal of a logical product of a first chip select signal CS1 which is positive logic in this figure, an upper byte select signal UB which is positive logic, a lower byte select signal LB which is positive logic, an output enable signal OE, a write enable signal WE, and the second chip select signal CS2. Note that these signals are all positive logic signals in this figure. The internal activate timing signal ACT corresponds to the internal activate signal ACT of FIG. 8.

In FIG. 11A, the pulse width of a first active pulse of the activate signal ACT2 is short, and thus the internal activate timing signal ACT is generated so as to satisfy the prescribed active period (read and rewrite). In a period in which the internal activate timing signal ACT is at high level, a second activate pulse of the activate signal ACT2 occurs. This means that, specifically, the interval between the first activate pulse and the second active pulse of the activate signal ACT2 is shorter than the prescribed active cycle. In this case, based on the internal activate signal ACT, an activate signal ACT2a is generated by leaving the first activate pulse of the activate signal ACT2 and ignoring the second activate pulse. Thus, instead of using the activate signal ACT2, the activate signal ACT2a to employ positive edge trigger enables generate one ACT pulse which satisfies the prescribed active cycle can be generated.

In FIG. 11B, the pulse width of the first activate pulse of the activate signal ACT2 is short, and falling of the second activate pulse occurs after the internal activate signal ACT falls. Also in this case, preventing to generate a pulse on ACT2a during ACT fall to ACT2 keeping high level, based on the internal activate signal ACT, the activate signal ACT2a is generated by leaving the first activate pulse of the activate signal ACT2 and ignoring the second activate pulse. Thus, the activate signal ACT2a which satisfies the prescribed active cycle can be generated.

In FIG. 11C, the pulse width of the first activate pulse of the activate signal ACT2 is short, and a period from falling of the internal activate signal ACT to falling of the second activate pulse of the activate signal ACT2 is longer than one active period. In this case, it is possible to start a second active cycle after ACT goes low and data destruction does not occur, but similarly to FIG. 11A and FIG. 11B, the activate signal ACT2a is generated by leaving the first activate pulse of the activate signal ACT2 and ignoring the second activate pulse based on the internal activate signal ACT. Thus, the activate signal ACT2a which satisfies the prescribed active cycle can be generated.

The signal waveforms of ACT2 in FIG. 11A to FIG. 11C can be realized by latching the internal activate signal ACT at a point of rising edge of the activate signal ACT2 by a D-type latch. The non-titled wave forms correspond that D-latch output indicating hold state by rectangles and arrows. Outside of the rectangles are through state that corresponds respective wave of ACT levels. Product of inversion of this signal and ACT2 generate ACT2a.

When the internal activate signal ACT is activated, even if an activation edge of the first chip select signal CS1 or the second chip select signal CS2 is inputted before the active cycle of the internal activate signal ACT returns to low level, the next active cycle of the internal activate signal ACT is not started thus re-triggering is prevented.

Further, even if the first chip select signal CS1 or the second chip select signal CS2 is activated at a time the active cycle of the internal activate signal ACT finishes, the next active cycle of the internal activate signal ACT is not started.

FIG. 12 is a diagram illustrating the activate signal ACT corresponding to a power-on signal PON. The power-on signal PON becomes high level when the power supply voltage Vdd rises above required a minimum voltage by power turning on, and becomes low level when the power supply voltage Vdd falls below required a minimum voltage by power cut-off. The latch circuit latches the power-on signal PON in synchronization with the activation edge of the chip select signal CS1 or CS2, and outputs this latched power-on signal PONQ. When the power-on signal PONQ is at high level, all generated timing signals are active and during the activate signal ACT is high level, the read to rewrite sequence on going. Even when the power supply voltage Vdd and the power-on signal PON fall during the activate signal ACT maintains the high level in the prescribed active period, the sequence continues to the end. The period in which the activate signal ACT is at high level is about 50 ns after the power supply voltage Vdd falls with slow decrease rate ex. 50 ms. Thus, normal data writing is performed in this active period, and data destruction can be prevented. On the other hand, when the power-on signal PONQ is at low level, all generated timing signals are gated and inactive namely remains to be low level.

When the power-on signal PON is inactivated at a time the active cycle of the internal activate signal ACT starts, all generated timing signals are gated and inactive, so that the active cycle of the internal activate signal ACT is not started. Further, when the power-on signal PON is activated at the time the activate cycle of the internal activate signal ACT starts, all generated timing signals are active, so that the active cycle of the internal activate signal ACT is started. Even when the power-on signal PON changes from an activated state to an inactivated state during the active cycle is going on, PONQ hold PON level at the cycle starting point so all generated timing signals are active and the read and rewrite sequence goes on to the end until the active cycle of the internal activate signal ACT finishes.

FIG. 13 is a circuit diagram illustrating a structural example of the activate signal generating circuit for generating the signals of FIG. 10A to FIG. 10D, FIG. 11A to FIG. 11C, and FIG. 12. The first chip select signal CS1, the upper byte select signal UB, the lower byte select signal LB, the output enable signal OE, the write enable signal WE, and the second chip select signal CS2 are all positive logic signals.

A logical sum circuit 1301 outputs a logical sum signal of the upper byte select signal UB and the lower byte select signal LB. A logical sum circuit 1302 outputs a logical sum signal of the output enable signal OE and the write enable signal WE. A logical product circuit 1303 outputs a logical product signal of the first chip select signal CS1, the output signal of the logical sum circuit 1301, and the output signal of the logical sum circuit 1302 as an activate signal ACT1. Plural inverters 1305 output a signal obtained by delaying and inverting the activate signal ACT1. A negative logical sum circuit 1306 outputs a negative logical sum signal of the output signal of the plural inverters 1305 and the activate signal ACT1 thus generating negative edge pulse of ACT1. A D-type latch circuit 1304 receives the activate (thorough) signal ACT1 and the second chip select signal CS2 to be latched, and outputs a latched signal CS1Q indicating active period ending with CS1 control. A negative logical product circuit 1307 outputs a negative logical product signal of an output signal of an inverter 1308, the output signal of the negative logical sum circuit 1306, and the signal CS1Q thus indicating active control signals are ending with CS1 by short pulse except during plate line is high. A logical product circuit 1309 outputs a logical product signal of a time out signal tOUT and the output signal of the negative logical product circuit 1307 as the reset signal rst thus including time-out reset.

A logical product circuit 1310 outputs a logical product signal of the activate signal ACT1 and the second chip select signal CS2 as an activate signal ACT2. An inverter 1311 outputs a logical inversion signal of the activate signal ACT2. A D-type latch circuit 1312 receives an activate signal ACT3 and the output signal of the inverter 1311, and outputs a latched signal thus preventing unintentional re-trigger the self-timing to start. An inverter 1313 outputs a logical inversion signal of the output signal of the D-type latch circuit 1312. A logical product circuit 1314 outputs a logical product signal of the activate signal ACT2 and the output signal of the inverter 1313. An inverter 1315 outputs a signal obtained by delaying and inverting the output signal of the logical product circuit 1314. A logical product circuit 1316 outputs a logical product signal of the output signal of the logical product circuit 1314 and the output signal of the inverter 1315 thus emitting a positive narrow pulse on rising edge of the AND 1314 output that is an original pulse of self-timing. A logical product circuit 1317 outputs a logical product signal of the reset signal rst and the output signal of the logical product circuit 1316. A first pulse width extending circuit 1318*a* receives the reset signal rst and outputs a signal obtained by extending a pulse width of the output signal of the logical product circuit 1317. A second pulse width extending circuit 1318*b* receives the reset signal rst and outputs a signal obtained by extending a pulse width of the output signal of the first pulse width extending circuit 1318*a*. A third pulse width extending circuit and so on are provided similarly to the first pulse width extending circuit 1318*a* and the second pulse width extending circuit 1318*b*, and generate pulse signals with plural types of pulse widths and timing delays, using desired delay signals from the 1318 series inverters taps and making two of them to compose a pulse. A logical sum circuit 1319 outputs a logical sum signal of the output signal of the logical product circuit 1317 and the output signals of the plural pulse width extending circuits 1318*a*, 1318*b*, and so on as an activate signal ACT3 indicating self-timing is ongoing.

An inverter 1320 outputs a logical inversion signal of the activate signal ACT3. A D-type latch circuit 1321 receives the output signal of the inverter 1320 and the power-on signal PON, and outputs a latched signal PONQ thus holding PON signal level during ACT3 activate period. A pulse width extending circuit 1318 has plural pulse width extending circuits such as the first pulse width extending circuit 1318*a* and the second pulse width extending circuit 1318*b*, and outputs plural pulse signals.

A logical product circuit 1322 outputs a logical product signal of the activate signal ACT3 and the power-on signal PONQ as an activate signal ACT3*f*. A logical product circuit 1323 outputs a logical product signal of an output pulse signal of the pulse width extending circuit 1318 and the power-on signal PONQ as a timing signal tN. A logical product circuit 1324 outputs a logical product signal of another output pulse signal of the pulse width extending circuit 1318 and the power-on signal PONQ as a plate line activate timing signal tPL this signal is connected to PL driver circuits and also used at 1308 and 1307 indicating PL is active. A logical product circuit 1325 outputs a logical product signal of still another output pulse signal of the pulse width extending circuit 1318 and the power-on signal PONQ as a time out signal tOUT indicating self-timing (ACT3 is high level) period has over. The inverter 1308 outputs a logical inversion signal of the plate line signal tPL.

The activate signal ACT1 is a combined signal of the first chip select signal CS1, the upper byte select signal UB, the lower byte select signal LB, the output enable signal OE, and the write enable signal WE. The activate signal ACT2 is a combined signal of the activate signal ACT1 and the second chip select signal CS2.

The D-type latch circuit 1304 outputs the signal CS1Q which indicates the relation between the chip select signals CS1 and CS2, which falls before. The signal CS1Q indicates that the chip select signal CS2 falls before CS1 falling as high level. The output signal of the negative logical sum circuit 1306 pulsing high level by falling edge of the activate signal ACT1. The reset signal rst is a signal for resetting, that is, forced termination of the pulse width extending circuits 1318*a*, 1318*b*, and so on. The negative logical product circuit 1307 receives a signal which is at low level in a period in which the plate line signal tPL is at high level, the output signal of the negative logical sum circuit 1306, and the signal CS1Q, and blocks propagation of the output pulse signal of the negative logical sum circuit 1306 in the period in which the plate line signal tPL is at high level and a period in which the signal CS1Q is at high level. Moreover, the logical product circuit 1309 outputs a signal which is reset by the time out signal tOUT with respect to the output signal of the negative logical product circuit 1307 as the reset signal rst.

The D-type latch circuit 1312 is for blocking the activate signal again in the prescribed active period when it is instructed from the outside, and latches the activate signal ACT2 by the activate signal ACT3. The logical product circuit 1314 controls transmission of the activate signal ACT2. The logical product circuit 1316 generates a short pulse by a rising edge of the output signal of the logical product circuit 1314. The pulse width extending circuits 1318*a*, 1318*b*, and so on generate a timing signal with a predetermined pulse width. Note that for each of the pulse width extending circuits 1318*a*, 1318*b*, and so on, a logical product circuit for resetting is provided so that all resets are completed in a short period.

Note that a signal is taken out from an arbitrary middle stage of the pulse width extending circuit 1318 (including the pulse width extending circuits 1318*a*, 1318*b*). The plural pulse signals ACT3*f*, tN, tPL, tOUT at necessary delay timings and pulse widths are generated in the logical product circuits 1322 to 1325. Further, the signal of the pulse width extending circuit 1318 is such that a logical product with the power-on signal PONQ is taken and is supplied to the respective units of the semiconductor memory device, thereby allowing the cycle operation only when the power supply voltage Vdd is equal to or more than a predetermined voltage.

The D-type latch circuit 1321 latches the power-on signal PON by the activate signal ACT3 and, in the cycle thereof, allows to operate until one active cycle finishes without being affected by a state change of the power-on signal PON. Further, even when the power-on signal PON changes from low level to high level in middle of high level of the activate signal ACT3, the D-type latch circuit 1321 stops transmission of a change of pulse signal to the respective units of the semiconductor memory device by the amount of one active cycle, thereby preventing a malfunction.

Figure 14:
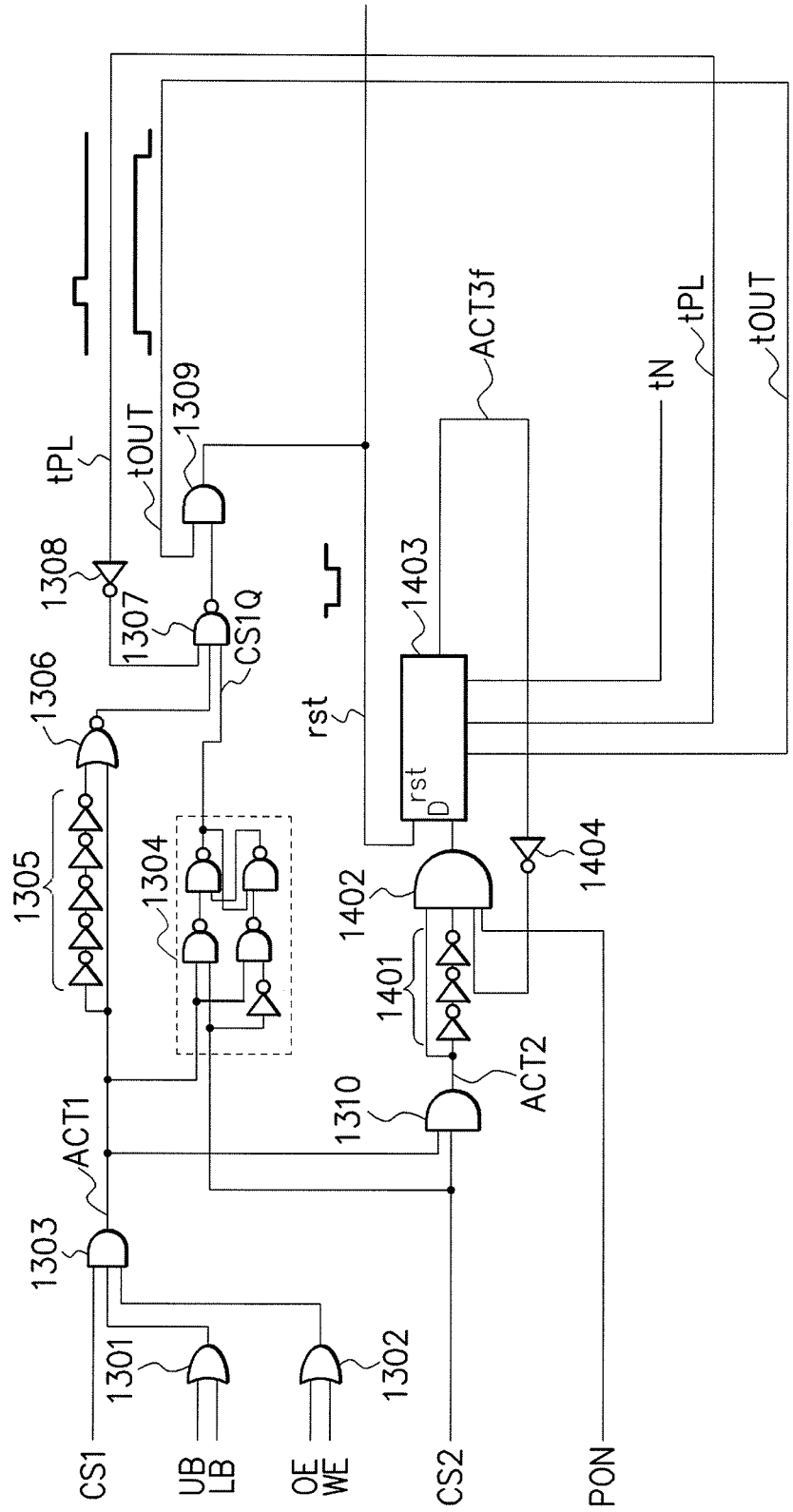
FIG. 14 is a circuit diagram illustrating another structural example of the activate signal generating circuit having a function similar to that of the activate signal generating circuit of FIG. 13.

FIG. 14 is a circuit diagram illustrating another structural example of the activate signal generating circuit having a function similar to that of the activate signal generating circuit of FIG. 13. Differences of the circuit of FIG. 14 from the circuit of FIG. 13 will be described below.

Plural inverters 1401 output a signal obtained by delaying and inverting the activate signal ACT2. A logical product circuit 1402 outputs a logical product signal of the activate signal ACT2, the output signal of the inverters 1401, an output signal of an inverter 1404, and the power-on signal PON. A pulse width extending circuit 1403 receives the reset signal rst, extends a pulse width of the output signal of the logical product circuit 1402, and outputs the activate signal ACT3*f*, the timing signal tN, the plate line signal tPL, and the time out signal tOUT. The inverter 1404 outputs a logical inversion signal of the activate signal ACT3*f*. The logical product circuit 1402 combines the power-on signal PON, and thus the signals tN, tPL, and tOUT can be taken out from an arbitrary middle stage of the pulse width extending circuit 1403, which allows to omit the logical product circuits 1322 to 1325 of FIG. 13.

The logical product circuit 1402 is a logic circuit which outputs an activate signal when the first chip select signal (first activate signal) CS1, the second chip select signal (second activate signal) CS2, and the power-on signal (third activate signal) PON are all in an activated state. When the logical product circuit 1402 outputs the activate signal, the pulse width extending circuit 1403 extends an active pulse width of the activate signal outputted by the logical product circuit 1402. Those functions are; by a narrow pulse of ACT2 rising edge it samples PON and inverted ACTf signals at the time then emit a narrow pulse when conditions are proper to start self-timing cycle. Then the narrow pulse is enlarged in 1403 thus eliminating two D-latches from in FIG. 13.

Figure 15A:
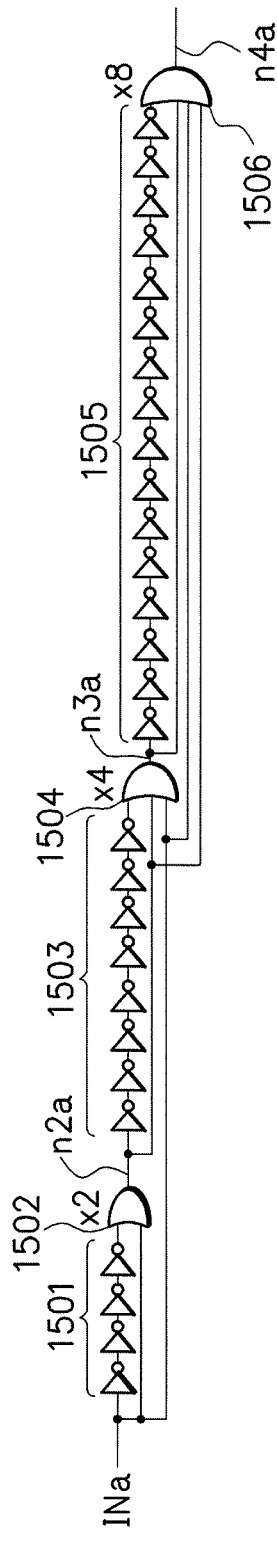
FIG. 15A and FIG. 15B are circuit diagrams illustrating a structural example of the pulse width extending circuit of FIG. 14.

FIG. 15A is a circuit diagram illustrating the principle of the pulse width extending circuit 1403 of FIG. 14, and in FIG. 15A, the reset signal is omitted. The pulse width extending circuit 1403 has inverters 1501, 1503, and 1505 and logical sum circuits 1502, 1504, and 1506. An output signal n2*a* of the logical sum circuit 1502 is a signal obtained by extending a positive pulse width of an input signal INa to twofold thereof. An output signal n3*a* of the logical sum circuit 1504 is a signal obtained by extending a positive pulse width of the input signal INa to fourfold thereof. An output signal n4*a* of the logical sum circuit 1506 is a signal obtained by extending a pulse width of the positive input signal INa to eightfold thereof. Unless extending the pulse width to twofold, fourfold, eightfold, and so on in steps, one short pulse of the input signal INa becomes plural divided pulses. This extension in twofold units is repeated until a target pulse width is reached. Bypassing input and ORing with inverters delay enables latency make small, and this further leads to increase in access speed.

Figure 15B:
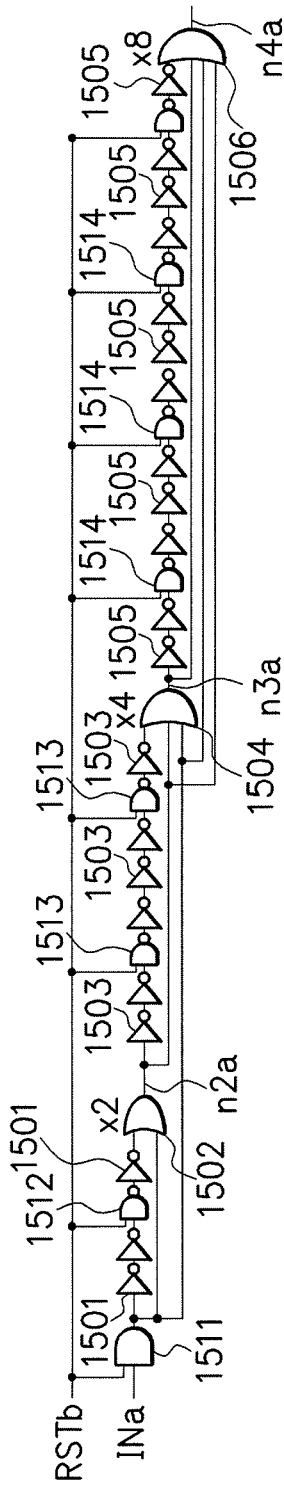

FIG. 15B is a circuit diagram illustrating a structural example of the pulse width extending circuit 1403 with a reset of FIG. 14. A reset signal RSTb is inputted to logical product circuits 1511 and negative logical product circuits 1512 to 1514, and these parallel resetting is capable of resetting at high speed with a narrow reset pulse and never leave inter propagating garbage pulse.

According to this embodiment, in the semiconductor memory device having terminals of two chip select signals /CS1 and CS2, a functional difference is provided between the first chip select signal /CS1 (forced termination, fast operation-cycle) and the second chip select signal CS2 (self-propelled termination, slow operation-cycle, capable of being connected to an external asynchronous reset), in addition allowing prevention of data destruction with respect to the asynchronous power-on signal PON that detect asynchronous power supply on/off. In operation of the semiconductor memory device, fast reading or writing is performed in the case where operation is controlled with the first chip select signal /CS1, and data destruction does not occur when operation is controlled with the second chip select signal CS2. Further, regarding the second chip select signal CS2 and the power-on signal PON, normal operation under prescribed operating conditions are performed, and data destruction can be prevented even when a situation which is not prescribed occurs.

An internal activate signal satisfying a regulation of an activate cycle is generated, and proper operation based on the internal activate signal can be assured.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An activate signal generating circuit, to which a first and a second activate signal are inputted, configured to generate an internal activate signal, the first and a second activate signal being pulse signals, the activate signal generating circuit comprising a first delay element, wherein:
    the internal activate signal is activated based on timings of front edges of the first and second activate signals;
    when a timing of a rear edge of the first activate signal is earlier than a timing of a rear edge of the second activate signal, the internal activate signal is inactivated based on the timing of the rear edge of the first activate signal; and
    when the timing of the rear edge of the first activate signal is later than the timing of the rear edge of the second activate signal, the internal activate signal is inactivated after a predetermined delay time based on a delay time of the first delay element.

2. The activate signal generating circuit according to claim 1, further comprising a second delay element, wherein:
    when a time from the timings of the front edges of the first and second activate signals to the timing of the rear edge of the first activate signal is longer than a time based on a delay time of the second delay element, the internal activate signal is activated after a predetermined delay time based on the delay time of the second delay element from the timings of the front edges of the first and second activate signals; and when the time from the timings of the front edges of the first and second activate signals to the timing of the rear edge of the first activate signal is shorter than the time based on the delay time of the second delay element, the internal activate signal is kept inactive.

3. The activate signal generating circuit according to claim 1, wherein:

when the internal activate signal is activated, a next active cycle of the internal activate signal is not started even when the front edge of the first or second activate signal is inputted before an active cycle of the internal activate signal finishes; and even when the first or second activate signal is activated at a time the active cycle of the internal activate signal finishes, the next active cycle of the internal activate signal is not started.

4. The activate signal generating circuit according to claim 1, wherein:

when a power-on signal is an inactivate state at a time an active cycle of the internal activate signal is to be started, the active cycle of the internal activate signal is prevented to start;

when the power-on signal is an activate state at the time the active cycle of the internal activate signal is to be started, the active cycle of the internal activate signal is started; and when the power-on signal changes from an activated state to an inactivated state before the active cycle of the internal activate signal finishes, the activated state of the internal activate signal is maintained until the active cycle of the internal activate signal finishes.

5. The activate signal generating circuit according to claim 1, further comprising:

a logic circuit which samples a third activate signal based on the timing of the front edge of the first or second activate signal, and outputs an internal pulse signal; and a pulse width extending circuit which extends the pulse width of the internal pulse signal and outputs the internal activate signal.

6. A semiconductor memory device, comprising:

the activate signal generating circuit according to claim 2; and a non-volatile memory element having a ferroelectric capacitor connected to a plate line, wherein:

the delay time of the second delay element is set to a time based on a delay time from the timing of the front edge of the first or second activate signal until when the plate line starts to operate.

7. The semiconductor memory device according to claim 6, wherein the delay time of the first delay element is set based on the timing of the front edge of the first or second activate signal and the plate line is made to rise, data of the non-volatile memory elements is latched by sense amplifiers, the plate line is made to fall, and the data is rewritten in the non-volatile memory elements.

* * * * *